United States Patent
Mehta et al.

[11] Patent Number: 6,060,766
[45] Date of Patent: *May 9, 2000

[54] PROTECTION OF HYDROGEN SENSITIVE REGIONS IN SEMICONDUCTOR DEVICES FROM THE POSITIVE CHARGE ASSOCIATED WITH PLASMA DEPOSITED BARRIERS OR LAYERS

[75] Inventors: Sunil D. Mehta, San Jose; William G. En, Sunnyvale, both of Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/918,244
[22] Filed: Aug. 25, 1997
[51] Int. Cl.[7] .................................................. H01L 29/06
[52] U.S. Cl. ...................... 257/639; 257/640; 257/641; 257/649; 257/315
[58] Field of Search ..................................... 257/316, 315, 257/639, 640, 641, 649

[56] References Cited

U.S. PATENT DOCUMENTS

| | | | |
|---|---|---|---|
| 4,271,582 | 6/1981 | Shirai et al. | 29/571 |
| 4,420,871 | 12/1983 | Scheibe | 257/316 |
| 4,982,250 | 1/1991 | Manos, II et al. | 257/316 |
| 5,208,174 | 5/1993 | Mori | 438/593 |

FOREIGN PATENT DOCUMENTS 63-288047  11/1988  Japan ..................... 257/316

OTHER PUBLICATIONS

R.C.Sun, J.T. Clemens and J.T. Nelson, "Effects of Silicon Nitride Encapsulation of MOS Device Stablilty," 1980 IEEE.

J. Givens, S. Geissler, O.Cain, W.Clark, C.Koburger,J.Lee, "A Low–Temperature Local Interconnect Process in a 0.25–micrometer–Channel CMOS Logic Technology with Shallow Trench Isolation," Jun. 7–8, 1994 VMIC, Conference 1994 ISMIC–103/94/0043.

*Primary Examiner*—J. Carroll
*Attorney, Agent, or Firm*—H. Donald Nelson

[57] ABSTRACT

A semiconductor device with first and second types of devices formed in a semiconductor substrate with a barrier layer formed over the surface of the semiconductor device including over the first and second types of devices with the barrier layer removed from over the first type of device. The first type of device is a positive charge sensitive device such as a nonvolatile memory device. The semiconductor device has a hydrogen getter layer formed under the barrier layer.

1 Claim, 13 Drawing Sheets

PROTECTION OF HYDROGEN SENSITIVE REGIONS IN SEMICONDUCTOR DEVICES FROM THE POSITIVE CHARGE ASSOCIATED WITH PLASMA DEPOSITED BARRIERS OR LAYERS

CROSS REFERENCE TO RELATED APPLICATIONS

This application is related to application Ser. No. 08/805,119, filed on Feb. 24, 1997, entitled SEMICONDUCTOR DEVICES WITH TUNGSTEN DAMASCENE LOCAL INTERCONNECTS HAVING A HYDROGEN GETTER LAYER AND A LOW HYDROGEN CONTENT LI ETCH STOP LAYER, application Ser. No. 08/917,153, filed on the filing date of this application, entitled FORMATION OF AN ETCH STOP LAYER FOR TUNGSTEN DAMASCENE INTERCONNECTS BY NITROGEN IMPLANTATION OF AMORPHOUS SILICON, and application Ser. No. 08/917,149, filed on the filing date of this application, U.S. Pat. No. 5,940,735 entitled REDUCTION OF CHARGE LOSS IN NON-VOLATILE MEMORY CELLS BY PHOSPHORUS IMPLANTATION INTO PECVD NITRIDE/OXYNITRIDE FILMS.

BACKGROUND OF THE INVENTION

1. Field of the Invention

This invention relates generally to high performance semiconductor devices with hydrogen sensitive regions protected by removing the barrier layer from over the hydrogen sensitive device and more specifically, to high performance semiconductor devices with hydrogen sensitive regions protected by removing the barrier layer from over the hydrogen sensitive areas and providing a hydrogen getter layer.

2. Discussion of the Related Art

The semiconductor industry is characterized by the dual requirements of an increase in the speed of integrated circuits and an increase in the density of elements in those integrated circuits. These two requirements have thus become the two major goals of the design engineers in their design and manufacturing efforts concerned with MOSFETs and other semiconductor devices, such as volatile and non-volatile memory devices. Increasing the density of elements in integrated circuits means that smaller channel lengths and widths have to be used. As the dimensions of semiconductor devices decreased, the existing "long-channel" performance models for MOSFET devices predicted that the decrease in the channel length, L, or the gate oxide thickness, $T_{ox}$, would increase $I_{DSAT}$. However, as MOSFET devices were scaled below approximately 2 μm, effects not predicted by the existing long channel models were observed and the unexpected effects were thereafter termed "short-channel" effects.

As device dimensions of MOSFETs continued to decrease, it was determined that problems associated with the short-channel effects could be placed in two general categories: (1) the problem of increased leakage current when the MOSFET is off and (2) reliability problems associated with short-channel and thin gate oxide device structures.

Some of the reliability problems that arise in short-channel and thin gate oxide MOSFETs include; (1) thin gate oxide breakdown, (2) device degradation due to hot-carrier effects, (3) reliability problems associated with interconnects between MOSFETs and (4) reliability problems associated with local interconnects. One of the major problems associated with semiconductor devices other than MOSFETs involves high-temperature data retention in nonvolatile memory cells. The two problems that are of particular interest are device degradation due to hot-carrier effects and high-temperature data retention problems in nonvolatile memory cells.

It has been observed that there are high-temperature data retention problems in nonvolatile memory cell arrays such as EPROMs, FLASH EPROMs, and $E^2$PROMs. It has been postulated that the poor high-temperature data retention is due to mobile hydrogen atoms that diffuse to the floating gate in a nonvolatile memory cell and cause the charge on the floating gate to be lost.

The reduced memory cell size and high-performance logic circuits has necessitated the use of borderless contacts and local interconnects. The borderless contacts and local interconnects have required the use of a barrier layer such as an etch stop or diffusion protect layer. The barrier layer is typically a high temperature PECVD nitride film, a high temperature PECVD oxynitride film or a high temperature LPCVD nitride film. The prior art developed a low-temperature, damascene-tungsten local interconnect for a 0.25 μm channel CMOS technology with trench isolation. One such prior art structure is described in "A Low-Temperature Local Interconnect Process in a 0.25-μm-channel CMOS Logic Technology with Shallow Trench Isolation," by J. Givens, S. Geissler, O. Cain, W. Clark, C. Koburger, J. Lee, 1994 VMIC Conference. However, the prior art includes the use of silicon nitride films that have high hydrogen content. The high hydrogen content has caused problems as described in the article "Effects of Silicon Nitride Encapsulation on MOS Device Stability," by R. C. Sun, J. T. Clemens and J. T. Nelson, IEEE 1980. This article describes a new threshold instability phenomenon observed in MOS transistors encapsulated with plasma deposited silicon nitride films and describes a series of experiments which indicated that the instability was due to a chemical effect associated with hydrogen in the silicon nitride films. The article postulated that the formation of surface states and fixed charges in the channel region was due to the interaction of hot carriers with hydrogen present at the interface and was the basic mechanism causing the instability.

Therefore, what is needed are semiconductor devices that have low amounts of free hydrogen and methods of manufacturing such low hydrogen content semiconductor devices.

SUMMARY OF THE INVENTION

The present invention is directed to a semiconductor device with a first type of device formed in a first portion of a substrate and at least a second type of device formed in the substrate. A barrier layer is formed on the semiconductor device over the first and second type of device. The barrier layer is removed from over the first type of device. The first type of device is a positive charge sensitive device such as a nonvolatile memory. The barrier layer is a high temperature PECVD silicon nitride film, a high temperature PECVD silicon oxynitride film, or a high temperature LPCVD nitride film.

The present invention is further directed to a semiconductor device having a hydrogen getter layer formed under the barrier layer. The hydrogen getter layer is selected from a group of a PSG film, a BPSG film, a PTEOS deposited oxide film, or a BPTEOS deposited oxide film. The hydrogen getter layer has a thickness of approximately 1000–2000 Angstroms.

The present invention is also directed to semiconductor devices having tungsten damascene interconnects.

The present invention is further directed to a method of manufacturing semiconductor devices having a first type of device formed in a first portion of a substrate and at least a second type of device formed in a second portion of the substrate. A barrier layer is formed on the semiconductor device. The barrier layer is formed of a material selected from the group including a high temperature PECVD silicon nitride film, a high temperature PECVD silicon oxynitride film, and a high temperature LPCVD nitride film. The barrier layer is removed from over the first type of device. The first type of device is a positive charge sensitive type device such as a nonvolatile memory device.

The method of the present invention includes forming a hydrogen getter layer under the barrier layer. The hydrogen getter layer is selected from a group of a PSG film, a BPSG film, a PTEOS deposited oxide film, and a BPTEOS deposited oxide film. The hydrogen getter layer is formed having a thickness of approximately 1000–2000 Angstroms.

The present invention is better understood upon consideration of the detailed description below, in conjunction with the accompanying drawings. As will become readily apparent to those skilled in the art from the following description there is shown and described embodiments of this invention simply by way of illustration of the best modes to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The accompanying drawings incorporated in and forming a part of the specification, illustrate the present invention, and together with the detailed description below serve to explain the principles of the invention. In the drawings:

FIGS. 1A–1D also illustrate selected steps in a method of manufacturing the semiconductor device.

FIGS. 2E–2G show the barrier layer removed from over the floating gate. FIGS. 2A–2G also illustrate selected steps in a method of manufacturing the semiconductor device.

FIGS. 3A–3I also illustrate selected steps in a method of manufacturing the semiconductor device.

FIGS. 4A–4L also illustrate selected steps in a method of manufacturing the semiconductor device.

FIGS. 5A–5J also illustrate selected steps in a method of manufacturing the semiconductor device.

DETAILED DESCRIPTION

Reference is now made in detail to specific embodiments of the present invention that illustrate the best modes presently contemplated by the inventors for practicing the invention.

Figure 1:
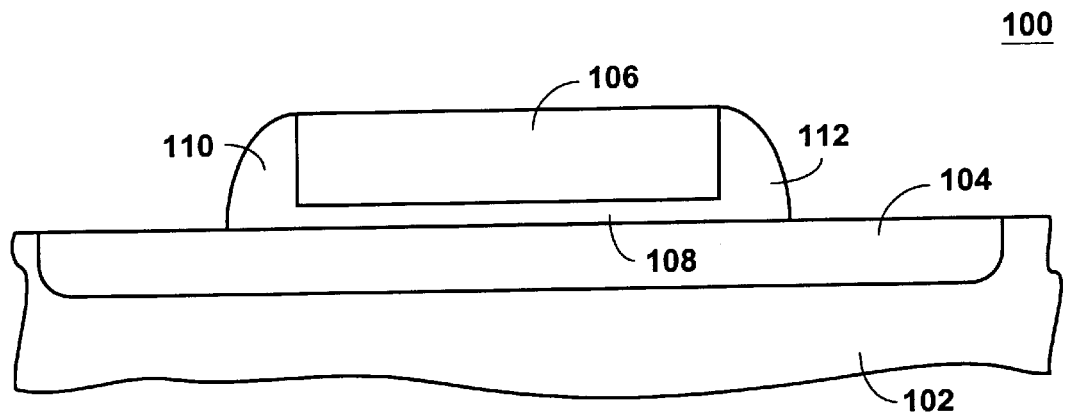
FIGS. 1A–1D show a portion of a prior art semiconductor device having a floating gate, a gate protect oxide layer and a barrier layer.
Figure 1:
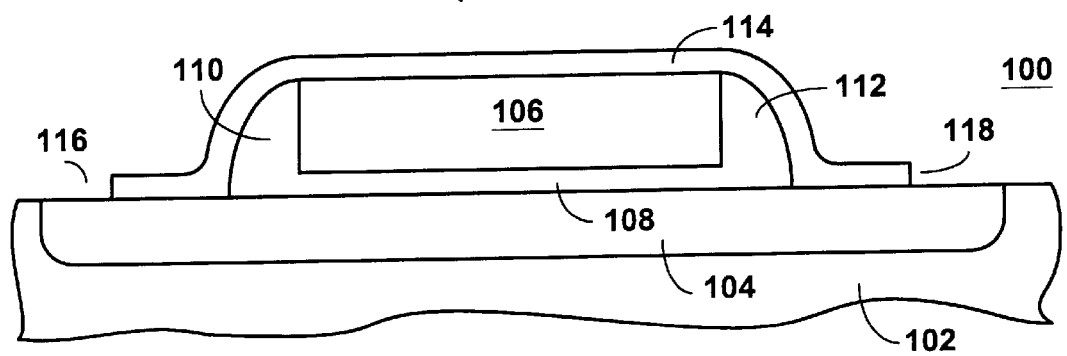
Figure 1:
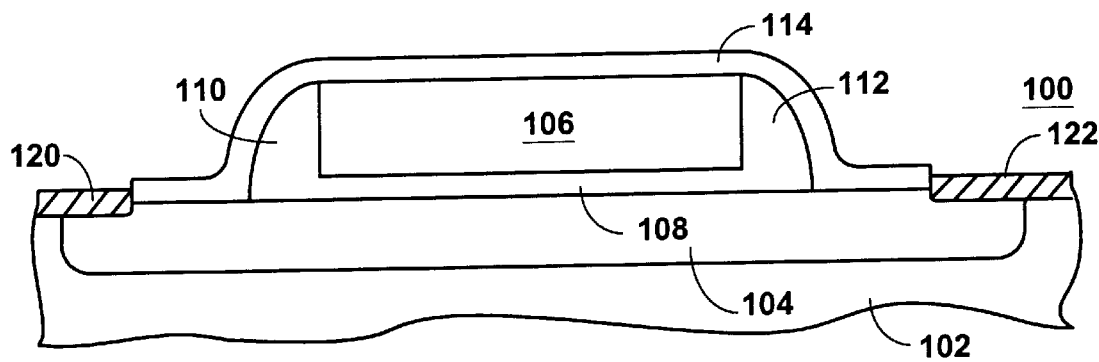
Figure 1:
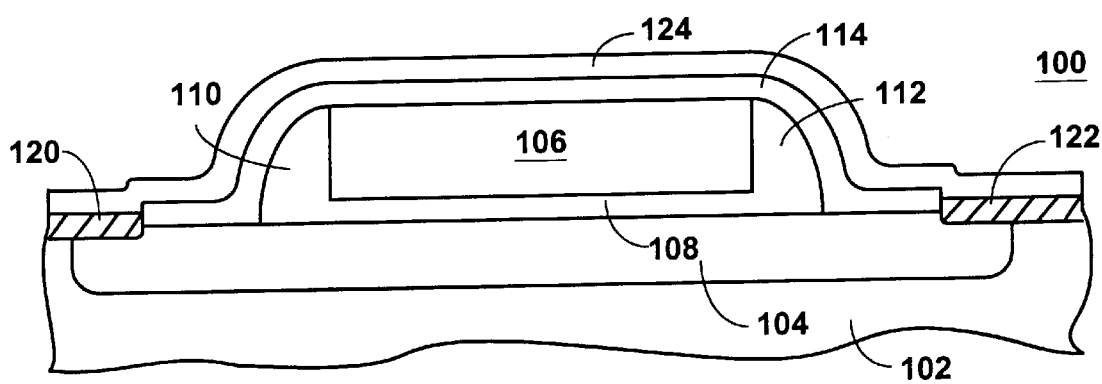

FIGS. 1A–1D show the structure and selected steps in a method of making a prior art semiconductor device 100 having a floating gate. Such a device could be used, for example, in a nonvolatile memory cell. Like numerical designations are used in each of the subsequent figures for like elements. FIG. 1A shows a semiconductor substrate 102 having a program junction region 104 formed in the semiconductor substrate 102. The floating gate 106 is separated from the program junction region 104 by a layer of gate oxide 108. The sidewall spacers 110 and 112 are formed on each side of the floating gate 106.

FIG. 1B shows the semiconductor device 100 as shown in FIG. 1A with a thin gate protect oxide layer 114 formed on the structure 100. The gate protect oxide layer 114 utilized in the prior art is typically an undoped oxide layer having a thickness of approximately 300 Angstroms and is utilized to protect portions of the device from forming a salicide (self-aligned silicide) layer in a subsequent step. The gate protect oxide layer 114 is shown etched away at 116 and 118 to allow salicide layers to form in areas not protected by the gate protect oxide layer 114.

FIG. 1C shows the semiconductor device 100 as shown in FIG. 1B showing salicide layers 120 and 122. The salicide layers are typically titanium silicide, $TiSi_2$ or cobalt silicide, $CoSi_2$.

FIG. 1D shows the semiconductor device 100 as shown in FIG. 1C with a barrier layer 124 formed on the semiconductor device 100. The barrier layer 124 in the prior art is typically a plasma oxynitride or nitride. A process to form such a layer is a PECVD (plasma enhanced chemical vapor deposition) at approximately 400° C.

Figure 2:
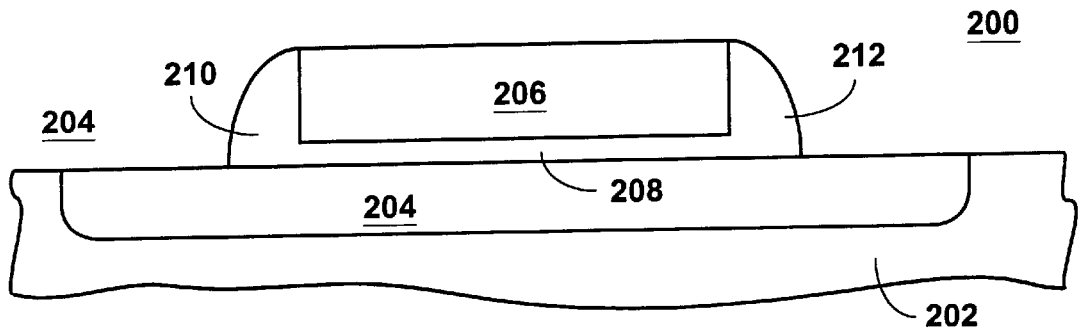
FIGS. 2A–2G show a portion of a semiconductor device manufactured in accordance with the present invention having a floating gate, a gate protect oxide layer, and a barrier layer formed over the entire semiconductor device.
Figure 2:
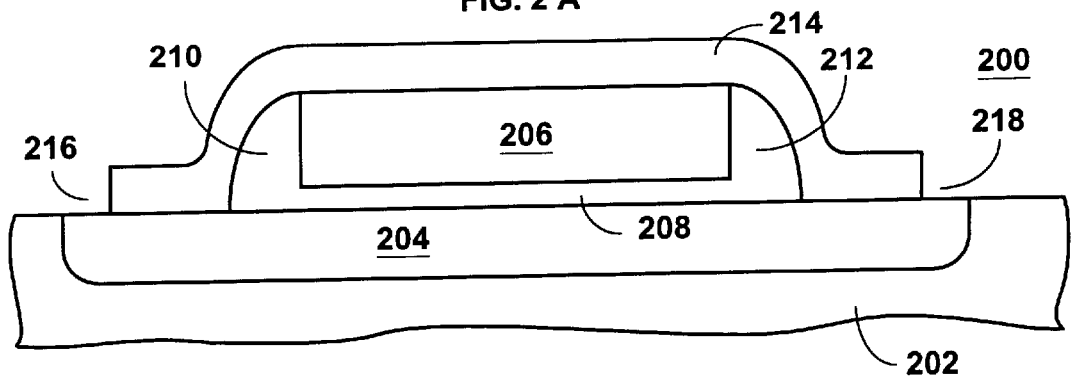
Figure 2:
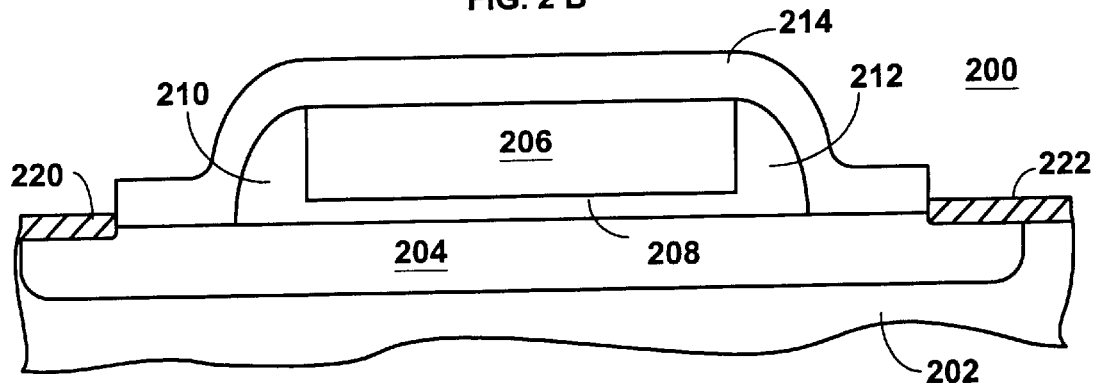
Figure 2:
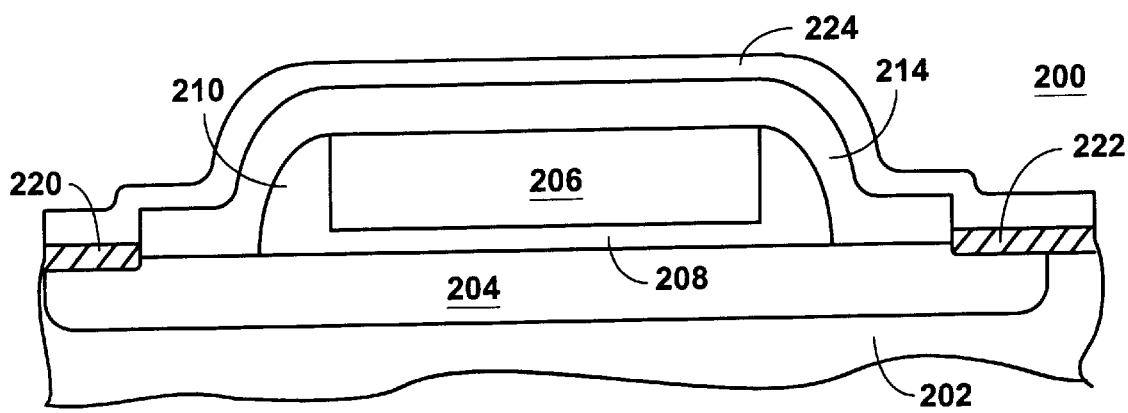
Figure 2:
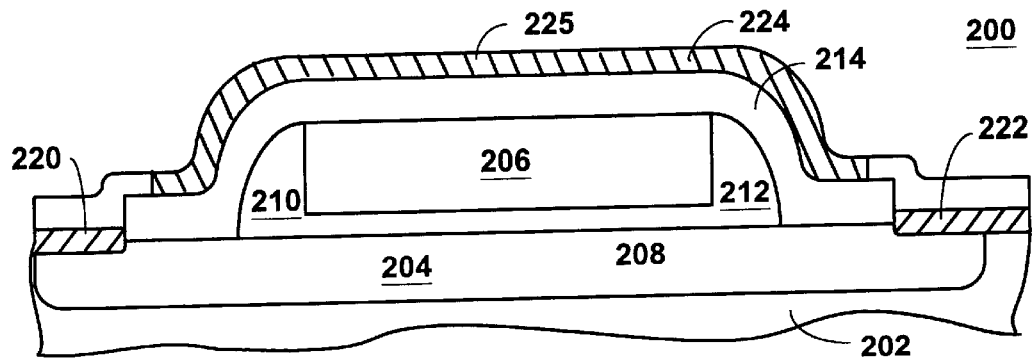
Figure 2:
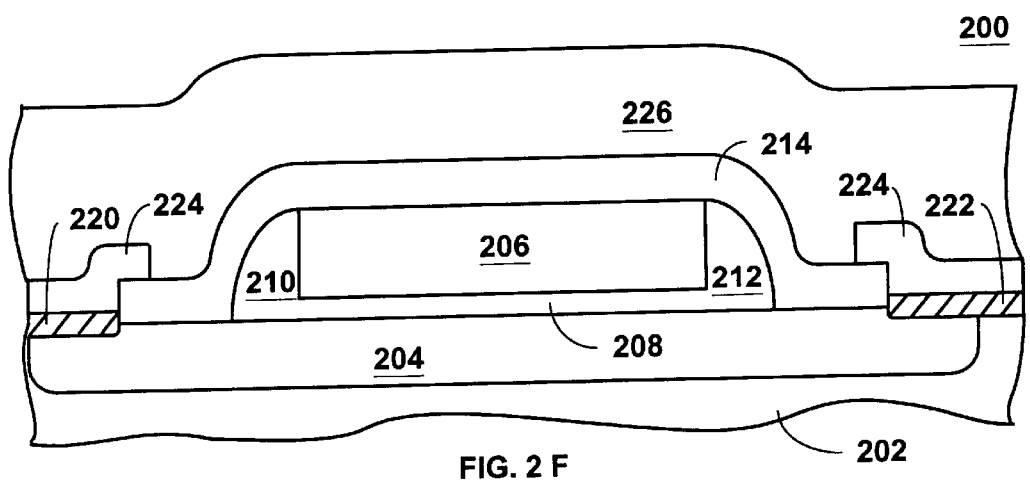
Figure 2:
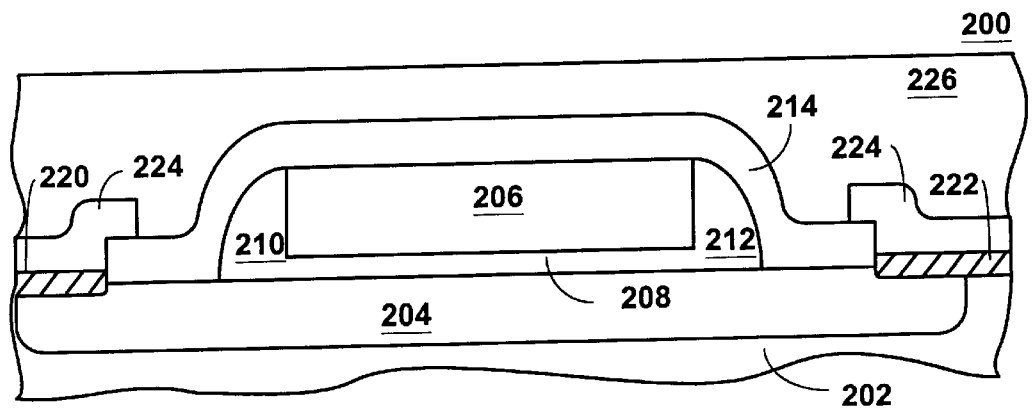

FIGS. 2A–2G show the structure and selected steps in a method of making a semiconductor device 200 having a substantially hydrogen-free floating gate in accordance with the present invention. Like numerical designations are used in each of the subsequent figures for like elements. FIG. 2A shows a semiconductor substrate 202 having a program junction region 204 formed in the semiconductor substrate 202. The program junction region 204 can be formed by the ion implantation of appropriate ions into the substrate 202. The floating gate 206 is separated from the program junction region 204 by a layer of gate oxide 208. The sidewall spacers 210 and 212 are formed on each side of the floating gate 206.

FIG. 2B shows the semiconductor device 200 as shown in FIG. 2A with a hydrogen getter layer 214. The hydrogen getter layer 214 is a P-doped (phosphorus-doped) film such as a PSG (phosphosilicate glass) film, a BPSG (borophosphosilicate glass) film, a PTEOS (phosphorus doped tetraethyl orthosilicate) deposited oxide film, or a BPTEOS (borophosphorus doped tetraethyl orthosilicate) deposited film. The purpose of the hydrogen getter layer 214 is to getter any mobile hydrogen ions present in the semiconductor device 200. The hydrogen getter layer 214 is preferably formed having a thickness of 1000–2000 Angstroms. The hydrogen getter layer 214 is shown etched away at 216 and 218 to allow a salicide layer to form in areas not protected by the P-doped film 214.

FIG. 2C shows the semiconductor device 200 as shown in FIG. 2B showing the salicide layers 220 and 222. The salicide layers are typically titanium silicide, $TiSi_2$, or cobalt silicide, $CoSi_2$. Methods of forming salicide are well known in the semiconductor manufacturing art and will not be discussed.

FIG. 2D shows the semiconductor device 200 as shown in FIG. 2C with the barrier layer 224 formed on the semiconductor device 200. The barrier layer 224 is formed by a high temperature process (500° C. or higher) and is typically a layer of PECVD nitride or an oxynitride film or an LPCVD (low pressure chemical vapor deposition) nitride film.

FIG. 2E shows the semiconductor device 200 as shown in FIG. 2D with a portion of the barrier layer 224, indicated by the cross-hatched section 225, which will be etched away. Portions of the barrier layer 224 that are over hydrogen sensitive portions of the semiconductor device are etched away to remove the mobile positive charge in the barrier layer 224 from the vicinity of the floating gate. The presence of the positive charge and or/hydrogen is inherently present in the materials used to form the barrier layer 224. Removing the portions of the barrier layer 224 from the vicinity of positive charge sensitive portions such as a floating gate 206 removes the source of the positive charge/hydrogen and thereby prevents the positive charge/hydrogen from contaminating the floating gate.

FIG. 2F shows a dielectric layer 226 formed on the semiconductor device 200. The dielectric layer 226 is formed on the entire semiconductor chip.

FIG. 2G shows the dielectric layer 226 planarized to provide a smooth flat surface on which the next layer is formed.

Figure 3:
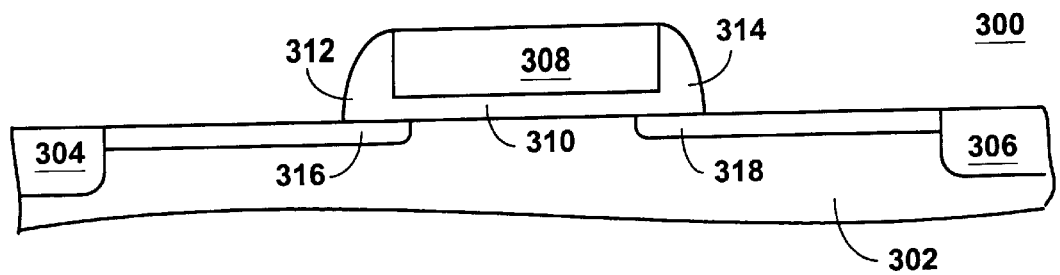
FIGS. 3A–3I show a portion of a prior art semiconductor device having a tungsten damascene local interconnect (LI), with the gate protect oxide layer removed to allow salicide layers to be formed on the semiconductor device, and a local interconnect etch stop layer.
Figure 3:
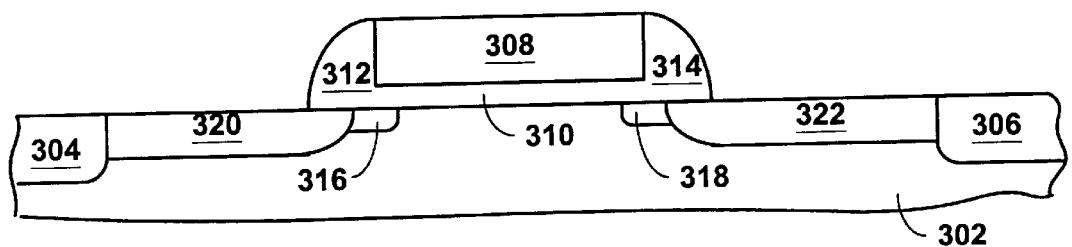
Figure 3:
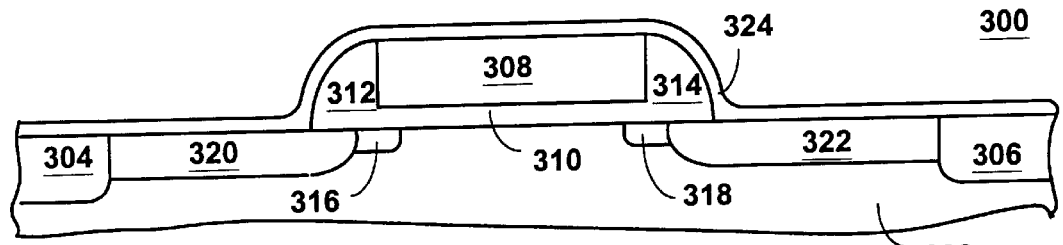
Figure 3:
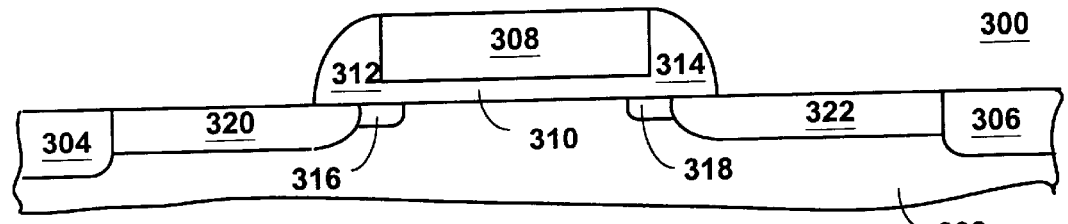
Figure 3:
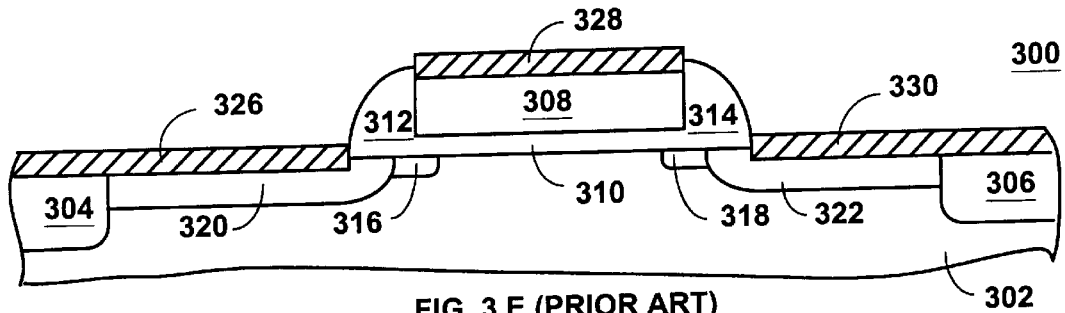
Figure 3:
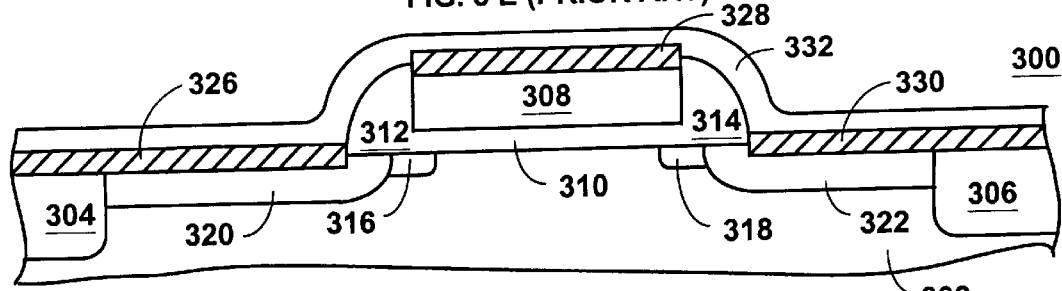
Figure 3:
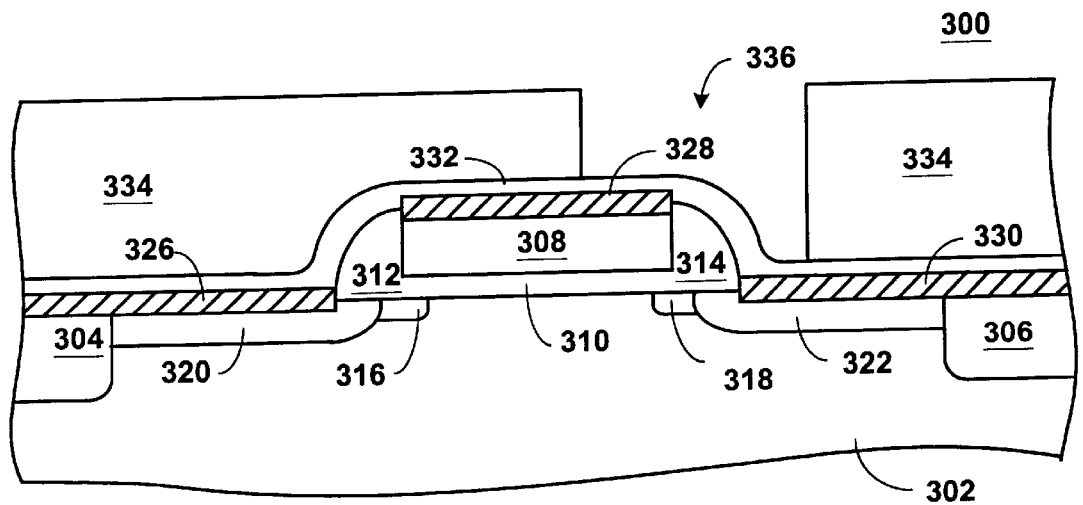
Figure 3:
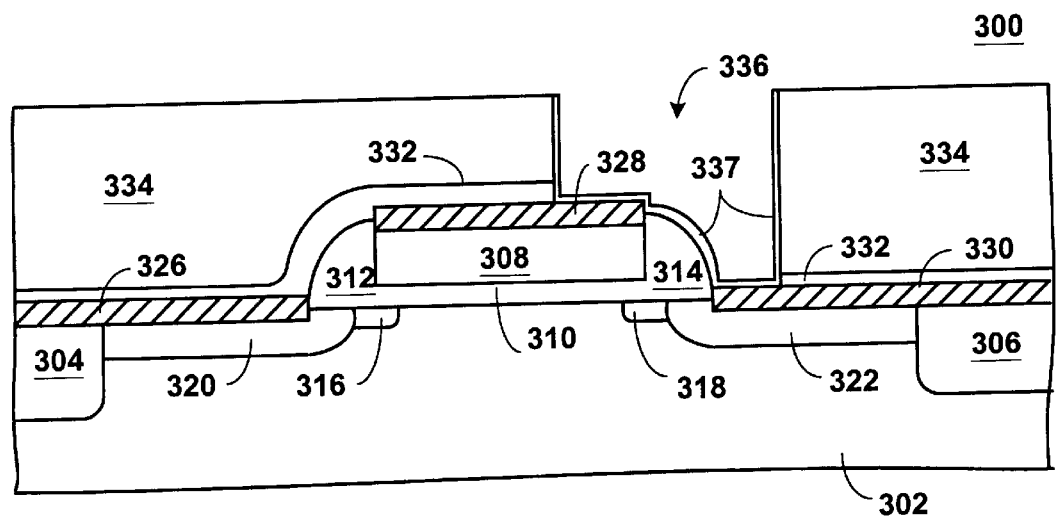
Figure 3:
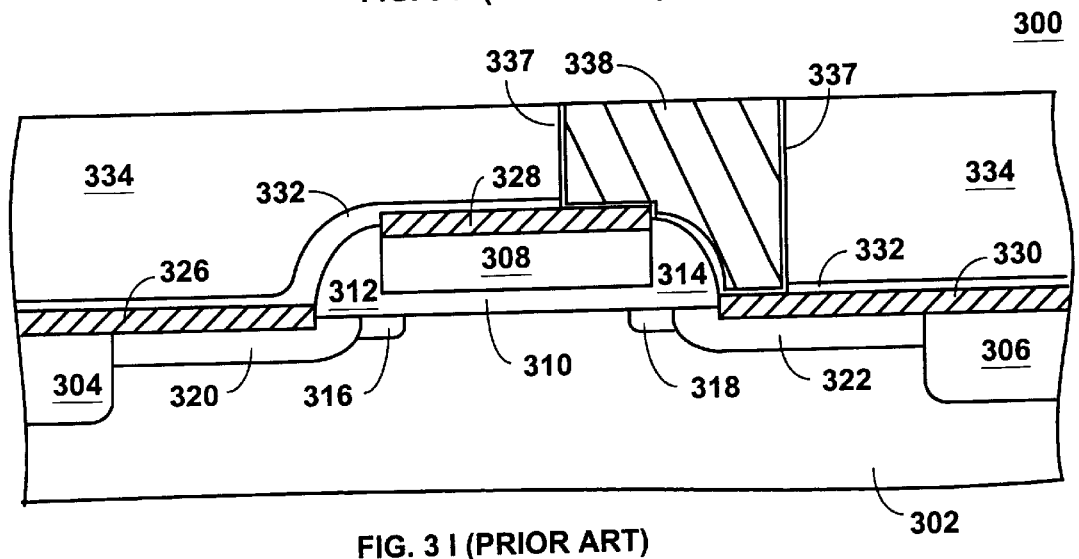

FIGS. 3A–3I show the structure and selected steps in a method of making a prior art semiconductor device 300. Like numerical designations are used in each of the subsequent figures for like elements. It should be appreciated that the device 300 shown in FIGS. 3A–3I is typically manufactured on a chip that also includes other semiconductor devices such as the semiconductor device 100 discussed in conjunction with FIGS. 1A–1D. FIG. 3A shows a portion of the semiconductor device 300 having a semiconductor substrate 302 with trench isolation regions 304 and 306. The trench isolation regions 304 and 306 can also be field oxide regions formed by a LOCOS process. The semiconductor device 300 has a gate 308, typically a polysilicon gate, separated from the semiconductor substrate 302 by a gate oxide layer 310 with sidewall spacers 312 and 314 formed on each side of the gate 308. Lightly doped drain (LDD) regions 316 and 318 are formed in the semiconductor substrate 302. The LDD regions 316 and 318 are typically formed by masking regions of the semiconductor device 300 and implanting selected ions into the substrate 302. Ions that can be used to form the LDD regions 316 and 318 are phosphorous ions at a dosage of about 1E13 ions per centimeter squared. The formation of the LDD regions 316 and 318 is typically done before the formation of the sidewall spacers 312 and 314. The methods of implanting ions are well known in the art and will not be discussed.

FIG. 3B shows the prior art semiconductor device 300 shown in FIG. 3A with a source region 320 and a drain region 322 formed in the semiconductor substrate 302. The formation of the source and drain regions 320 and 322 is typically done by ion implantation of appropriate ions. The process of implanting ions to form source and drain regions in a semiconductor device is well known in the semiconductor manufacturing art and will not be discussed. The concentration of the ions in the source and drain regions 320 and 322 is greater than the concentration of the ions in the LDD regions 316 and 318 and thus, the LDD regions 316 and 318 are shown subsumed by the source and drain regions 320 and 322. Ions that are typically implanted into the source and drain regions 316 and 318 are arsenic ions at a dosage of about 1E15 ions per centimeter squared. It should be appreciated that other ions can be used to form either the LDD regions or the source and drain regions.

FIG. 3C shows the prior art semiconductor device 300 shown in FIG. 3B with a gate protect oxide layer 324 formed over the entire surface of the semiconductor device 300. The gate protect oxide layer 324 in prior art devices is typically 300 Angstroms thick. The purpose of the gate protect oxide layer 324 is to protect selected areas of the device 300 from forming a salicide layer in a subsequent step of the manufacturing process. It should be appreciated that the portion of the device 300 shown in FIGS. 3A–3I is only one portion of the entire device and the gate protect oxide layer 324 can be formed over the entire surface of the device.

FIG. 3D shows the semiconductor device 300 shown in FIG. 3C after the gate protect oxide layer 324 has been removed.

FIG. 3E shows the prior art semiconductor device 300 shown in FIG. 3D with a salicide layer 326 formed on the source region 320, a salicide layer 330 formed on the drain region 322, and a salicide layer 328 formed on the gate region 308. The salicide is typically titanium silicide, TiSi2, or cobalt silicide, $CoSi_2$, and is formed by methods well known in the semiconductor manufacturing art and will not be discussed.

FIG. 3F shows the prior art semiconductor device 300 shown in FIG. 3E with a barrier layer 332 formed on the entire semiconductor device 300. The barrier layer 332 is typically a plasma silicon oxynitride or a silicon nitride film and the barrier layer is used to protect features of a semiconductor device from the typical etch materials used to etch silicon dioxide.

FIG. 3G shows the prior art semiconductor device 300 shown in FIG. 3F with a dielectric layer 334 that has been formed on the device 300 and has been selectively etched to leave an opening, indicated at 336, that exposes a selected portion of the underlying device. A method of forming such an opening is to deposit or form a dielectric layer 334 on the entire semiconductor device 300 and then etch selected portions of the dielectric layer 334 to expose underlying regions of the semiconductor device 300. Typical materials that are used to etch the dielectric layer are $C_4F_8$ or a combination of $C_4F_8$ and $CH_3F$. The purpose of barrier layer 332 is to stop the etch materials used to etch the dielectric layer from etching the material underlying the dielectric layer. The purpose of the dielectric layer 334 is to electrically insulate the underlying portions of the device 300 from other elements that may be manufactured above the dielectric layer 334. As will be shown, the opening 336 allows electrical contact between selected portions of the underlying device 300 and selected portions of any device manufactured above the dielectric layer 334.

FIG. 3H shows the portion of the barrier layer 332 having been etched away after being exposed by the opening 336. As is known in the semiconductor manufacturing art, the process of forming interconnects is a two-step process. The first step is to selectively etch portions of the dielectric layer 334. Barrier layer 332 prevents the dielectric etch material from etching the materials underlying the barrier material. After the dielectric layer 334 is etched, the barrier layer 332 is then etched to expose selected areas of the underlying material. The barrier layer 332 is typically etched by an etch material such as $CH_3F$ & $O_2$. FIG. 3H shows the surfaces of the opening 336 coated with an adhesion layer 337 such as titanium nitride or a combination of titanium and titanium nitride.

FIG. 3I shows the semiconductor device 300 with the opening 336 filled with a conductive material 338 after the adhesion layer 337 is formed on the surfaces of the opening 336. The semiconductor device 300 is typically planarized after the interconnect material 338 is formed so that the next layer manufactured has a smooth surface. Materials that are used for interconnects are conductive materials such as tungsten. The interconnect shown and described in FIGS. 3A–3I electrically connects the gate 308 to the drain region 322. As can be appreciated by one of ordinary skill in the art, the region indicated as being a drain region 322 could also be a source region and the gate could also be selected to be electrically connected to the source region of the device. As can also be appreciated, any combination of elements can be electrically connected, either on the same device or other devices in the semiconductor device. It is also noted that the method of forming a dielectric layer, etching an opening in the dielectric layer, and filling the opening with a conductive material is known in the art as the damascene method.

Figure 4:
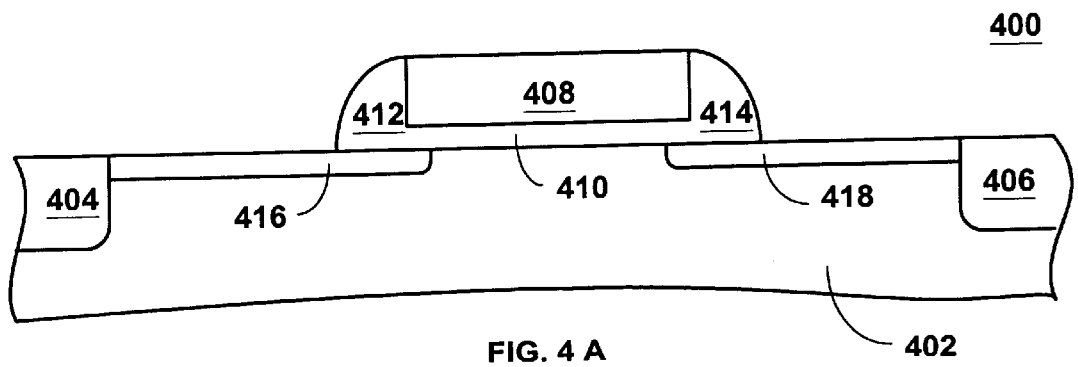
FIGS. 4A–4L show a portion of a semiconductor device manufactured in accordance with the present invention having a tungsten damascene local interconnect (LI) or an interconnect to a source or drain electrode.
Figure 4:
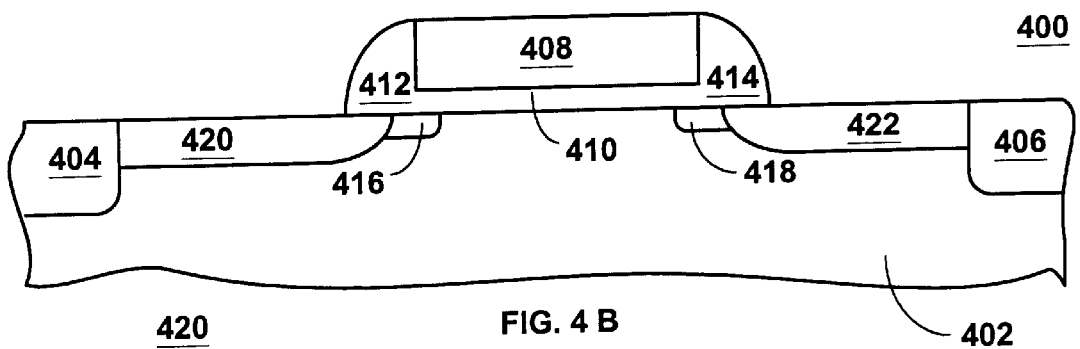
Figure 4:
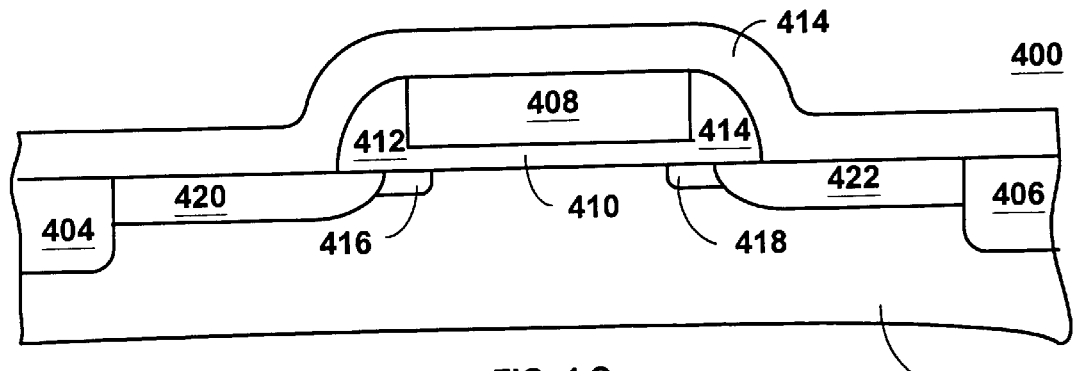
Figure 4:
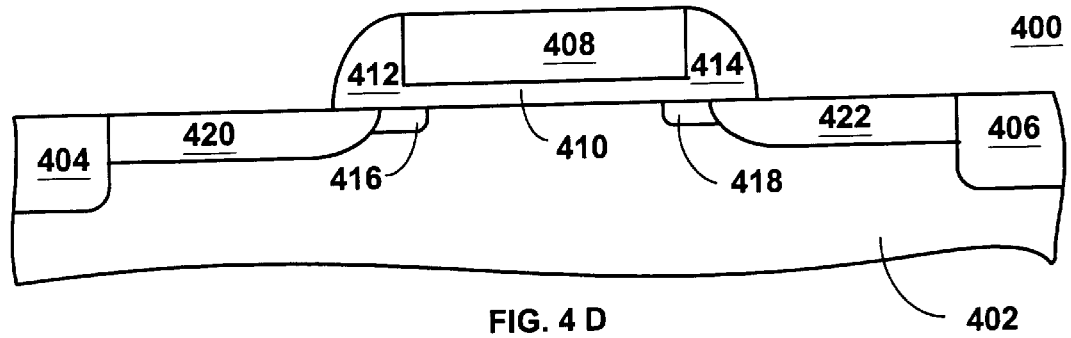
Figure 4:
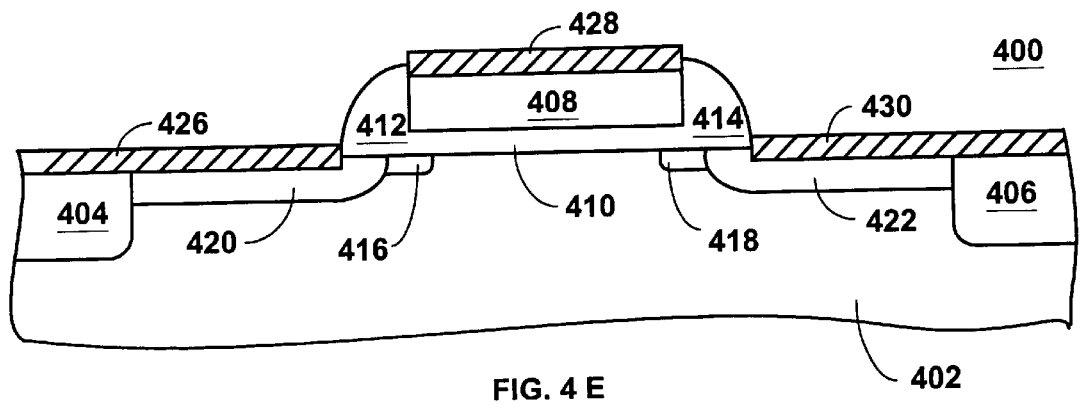
Figure 4:
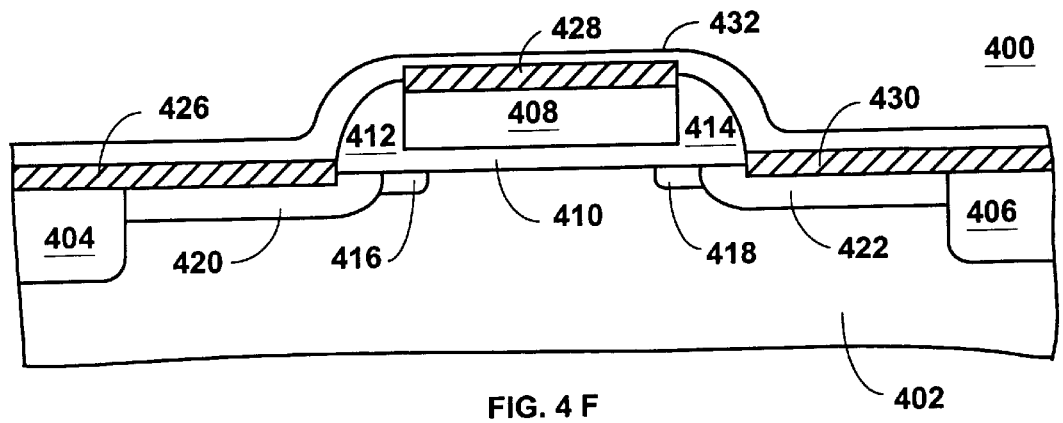
Figure 4:
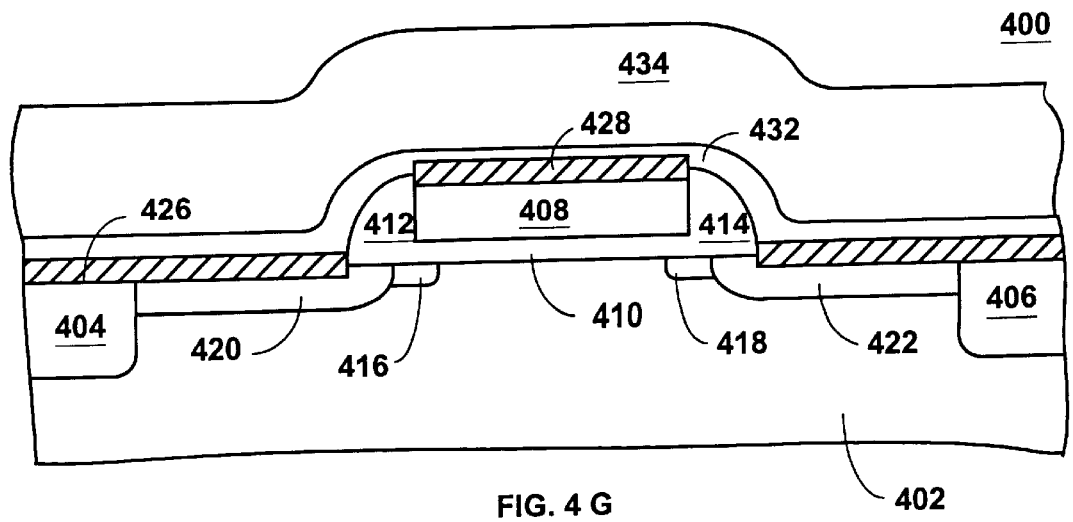
Figure 4:
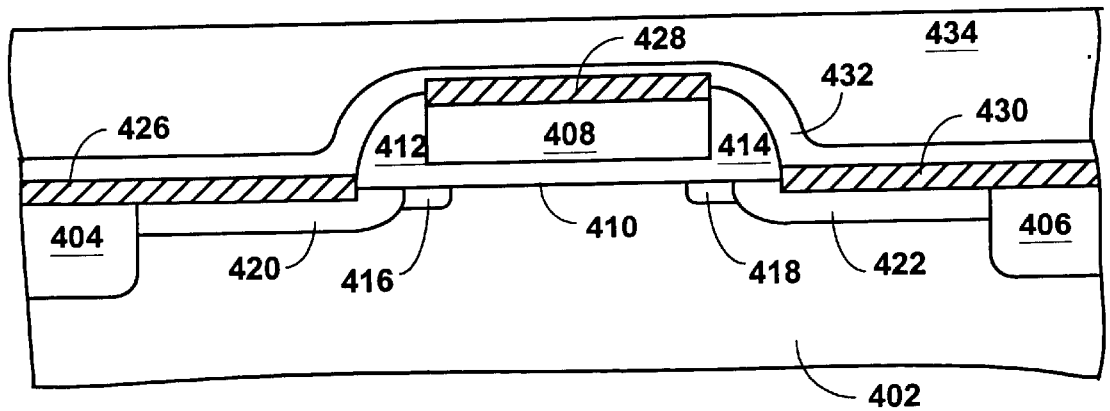
Figure 4:
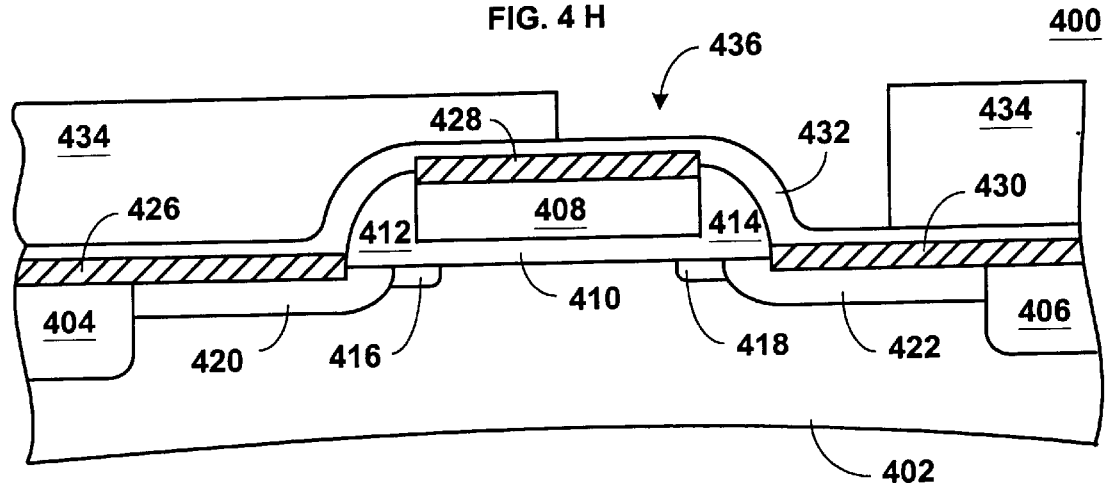
Figure 4:
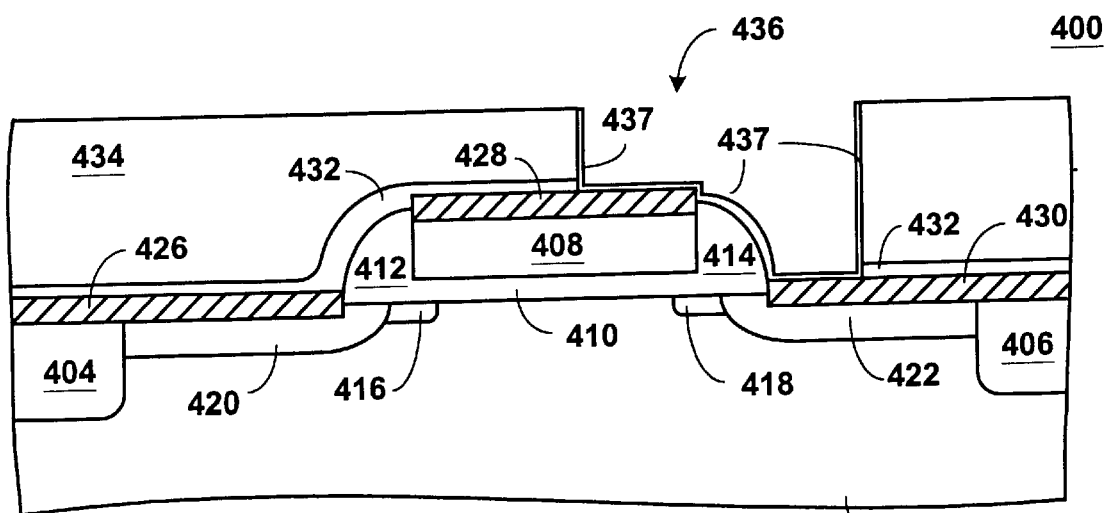
Figure 4:
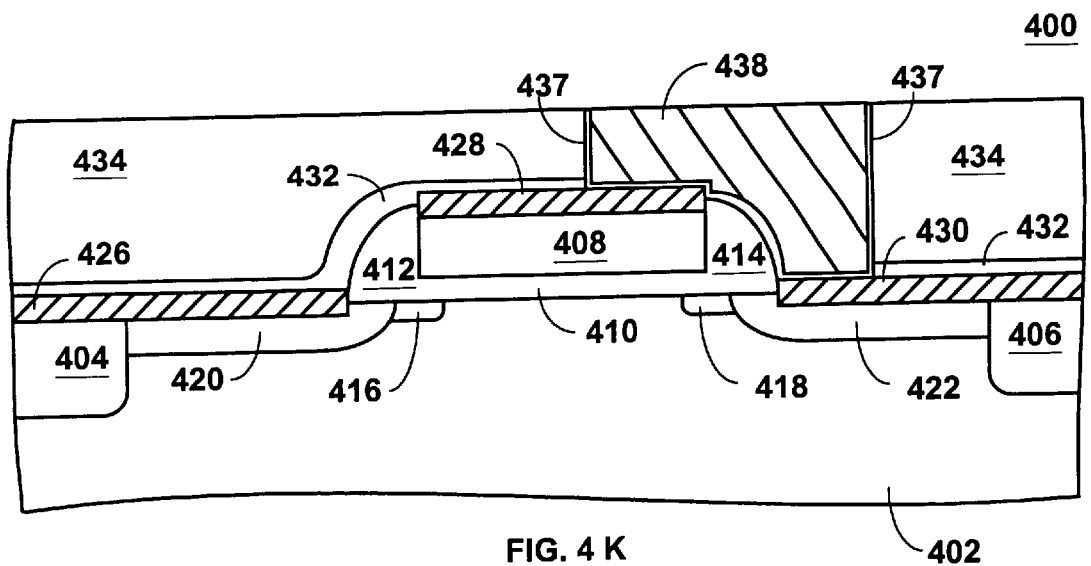
Figure 4:
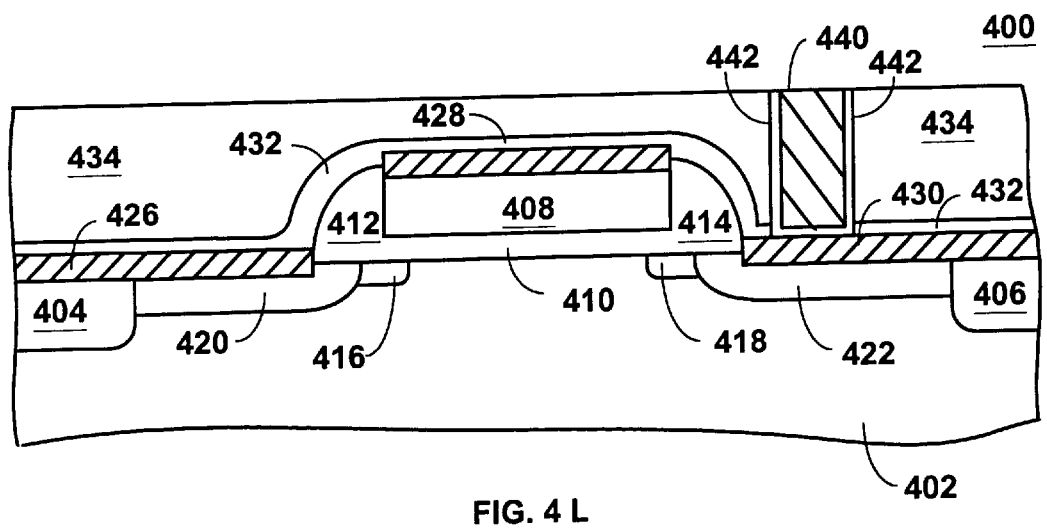

FIGS. 4A–4I show the structure and a method of making a semiconductor device 400 in accordance with the present invention having salicide layers. Like numerical designations are used in each of the subsequent figures for like elements. It should be appreciated that the semiconductor device 400 is a portion of a semiconductor chip and can be manufactured on a chip that also includes a semiconductor device 200 described above in conjunction with FIGS. 2A–2E. FIG. 4A shows a portion of the semiconductor device 400 manufactured in a semiconductor substrate 402 with trench isolation regions 404 and 406. The trench isolation regions 404 and 406 regions can also be field oxide regions formed by a LOCOS process. The semiconductor device 400 has a gate 408, typically a polysilicon gate, separated from the semiconductor substrate by a gate oxide layer 410 with the sidewall spacers 412 and 414 formed on each side of the gate 408. The lightly doped drain (LDD) regions 416 and 418 are formed in the semiconductor substrate 402. The LDD regions 416 and 418 are typically formed by masking regions of the device 400 and implanting selected ions into the substrate 402. The formation of the LDD regions is typically done before the formation of the sidewall spacers 412 and 414. Ions that can be used to form LDD regions are phosphorous ions at a dosage of about 1E13 ions per centimeter squared. The methods of implanting ions are well known in the semiconductor manufacturing art and will not be discussed.

FIG. 4B shows the semiconductor device 400, as shown in FIG. 4A, with a source region 420 and a drain region 422 formed in the semiconductor substrate 402. The formation of the source and drain regions 420 and 422 is typically done by ion implantation of appropriate ions and is well known in the semiconductor manufacturing art and will not be discussed. The concentration of the ions in the source and drain regions 420 and 422 is greater than the concentration of the ions in the LDD regions 416 and 418 and thus, the LDD regions 416 and 418 are shown subsumed by the source and drain regions 420 and 422. Ions that are typically implanted into the source and drain regions 416 and 418 are arsenic ions at a dosage of about 1E15 ions per centimeter. It should be appreciated that other ions can be used to form either the LDD regions or the source and drain regions.

FIG. 4C shows the semiconductor device 400 with a hydrogen getter layer 424 formed over the entire surface of the device 400. The hydrogen getter layer 424 is a film such as a PSG (phosphosilicate glass) film, a BPSG (borophosphosilicate glass) film, a PTEOS (phosphorus doped tetraethyl orthosilicate) deposited oxide film, or a BPTEOS (borophosphorus-doped tetraethyl orthosilicate) deposited oxide film. The hydrogen getter layer 424 has a thickness between 1000 and 2000 Angstroms. The purpose of the hydrogen getter layer 424 is to getter mobile hydrogen and, in addition, to protect selected underlying areas from forming salicide layers in subsequent processing steps. The portion of the device 400 shown in FIGS. 4A–4L is only one portion of the entire device and the hydrogen getter layer 424 is formed over the entire surface of the device. FIG. 4D shows the device 400 with the hydrogen getter layer 424 removed from the portion of the device shown in FIGS. 4A–4L. The hydrogen getter layer 424 is removed from this portion of the device 400 because it is intended that salicide layers will be formed on the selected portions of the device 400. The hydrogen getter layer 424 is not removed from portions of the device 400 that are not to form a salicide layer.

FIG. 4E shows the semiconductor device 400 with a salicide layer 426 formed on the source region 420, a salicide layer 430 formed on the drain region 422, and a salicide layer 428 formed on the gate region 408. The salicide layer is typically titanium silicide, $TiSi_2$, or cobalt silicide, $CoSi_2$, and is formed by methods well known in the semiconductor manufacturing art and will not be discussed.

FIG. 4F shows the semiconductor device 400 with the barrier layer 432 formed on the entire semiconductor device 400. The barrier layer 432 is typically a high temperature (500° C. or higher) plasma silicon nitride, silicon oxynitride or an LPCVD silicon nitride film. The barrier layer 432 is used to protect underlying features of the semiconductor device 400 from the typical etch materials used to etch silicon dioxide.

FIG. 4G shows the semiconductor device 400 with a dielectric layer 434 formed on the semiconductor device 400. The purpose of the dielectric layer 434 is to electrically insulate the underlying portions of the device 400 from other elements that may be manufactured above the dielectric layer 434.

FIG. 4H shows the semiconductor device 400 with the dielectric layer 434 planarized to provide a smooth surface for subsequent manufacturing processes.

FIG. 4I shows the semiconductor device 400 with an opening 436 etched in the dielectric layer 434. Openings, such as the opening 436, allow electrical contact between selected portions of one layer of the semiconductor device 400 and selected portions of any device manufactured above the dielectric layer 434 or allow electrical contact between selected portions on the same layer of the device 400.

FIG. 4J shows that the portion of the barrier layer 432 exposed by the opening 436 has been etched away and an adhesion layer 437 formed on the surfaces of the opening 436.

FIG. 4K shows the opening filled with a conductive material 438, such as tungsten, which electrically connects the gate 408 to the drain region 422. It is noted that the salicide is electrically conductive and the electrical contact is established through the salicide.

FIG. 4L shows an alternative embodiment wherein an opening etched in the dielectric layer 434 only exposes a portion of the drain region 422. The opening is filled with a conductive material such as tungsten. The electrical connection 440 to the drain region 422 is to connect the drain region 422 to another device or other devices in the same layer in the semiconductor device 400 or to another device or other devices in a different layer in the semiconductor device 400. The opening is coated with an adhesion layer 442.

Figure 5:
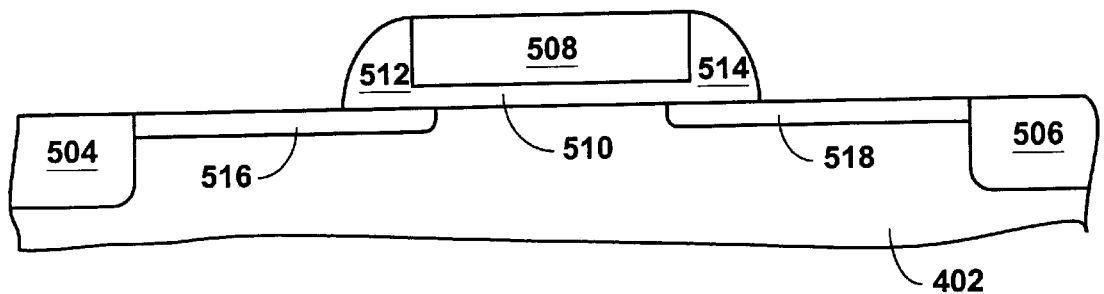
FIGS. 5A–5J show a portion of a semiconductor device manufactured in accordance with the present invention having a tungsten damascene local interconnect (LI) or an interconnect to a source or drain electrode.
Figure 5:
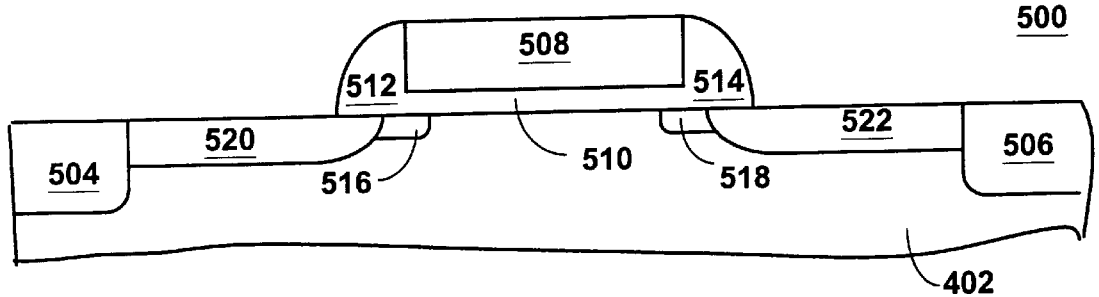
Figure 5:
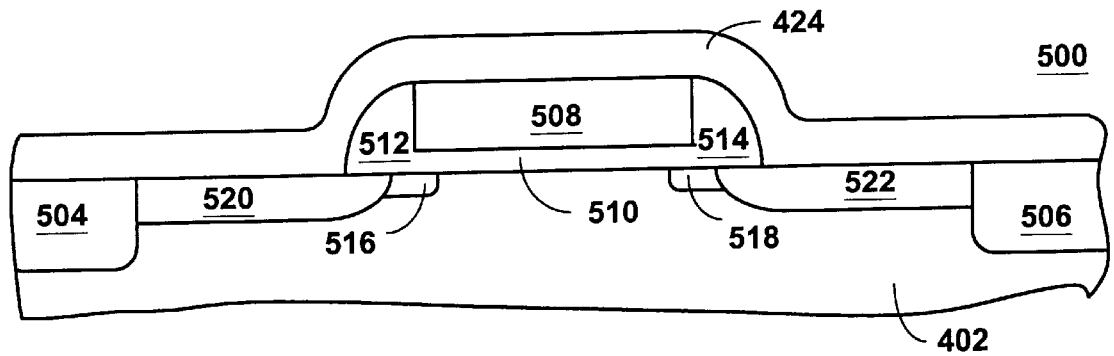
Figure 5:
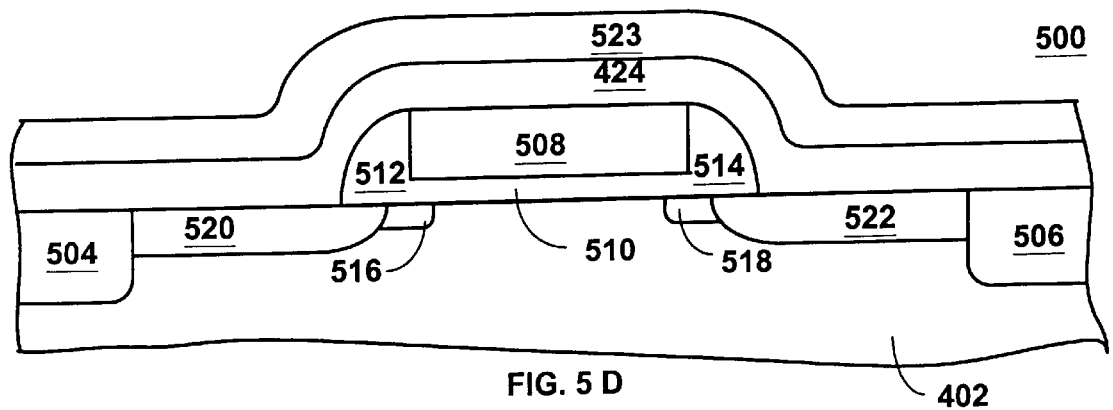
Figure 5:
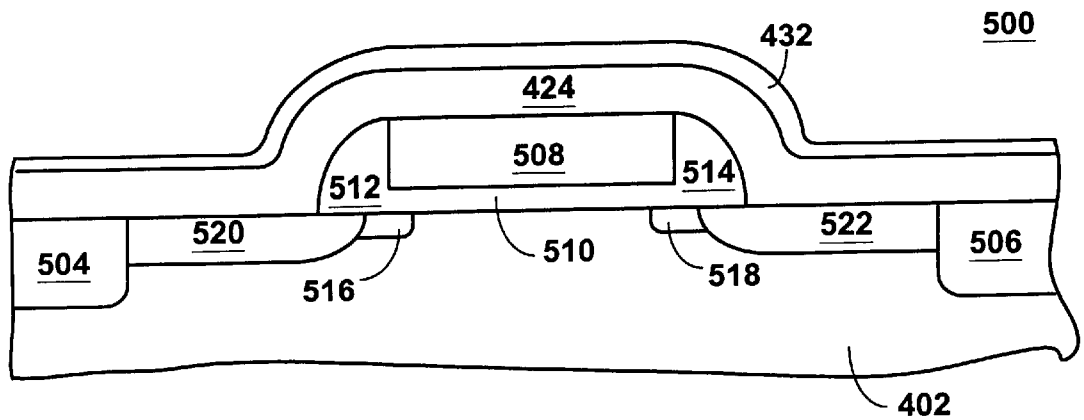
Figure 5:
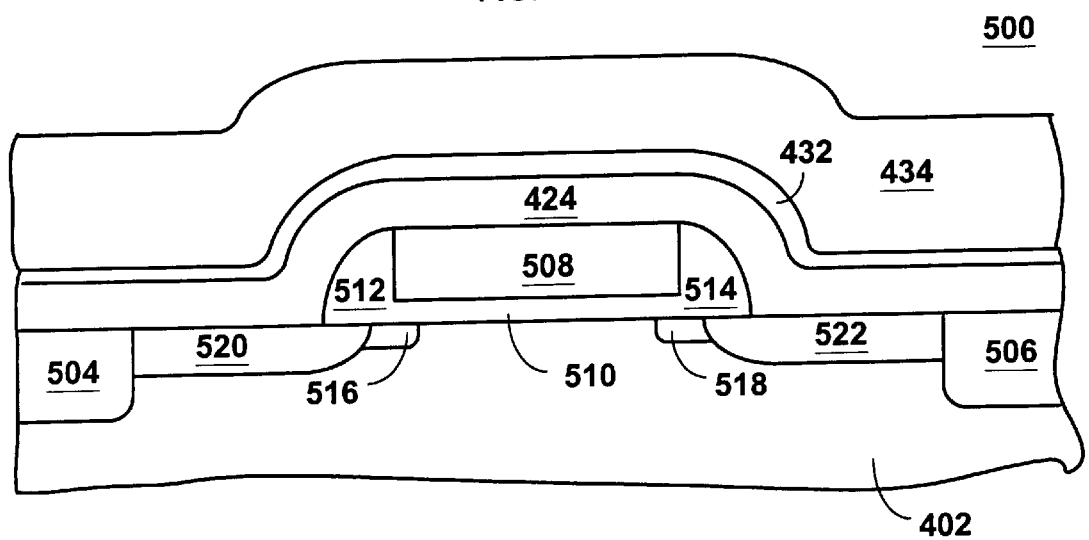
Figure 5:
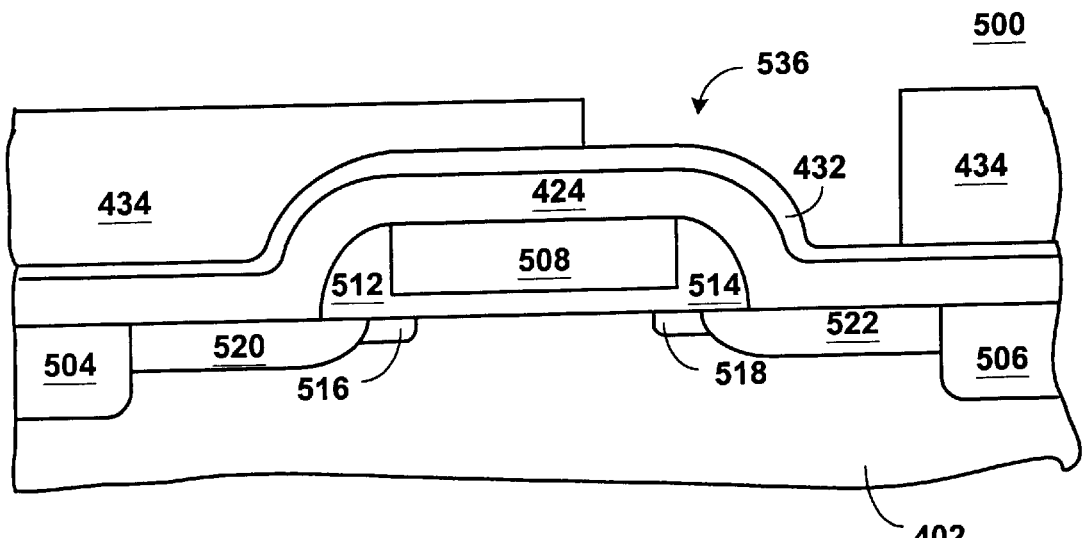
Figure 5:
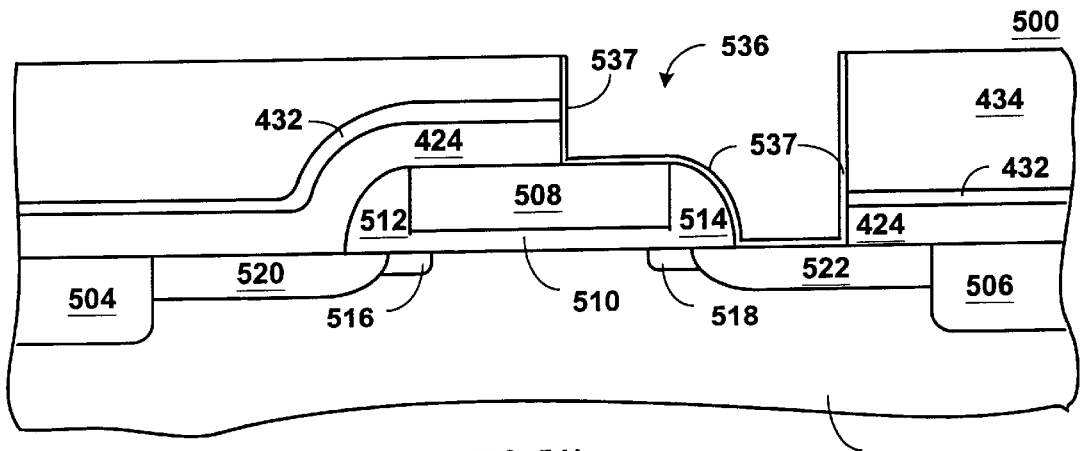
Figure 5:
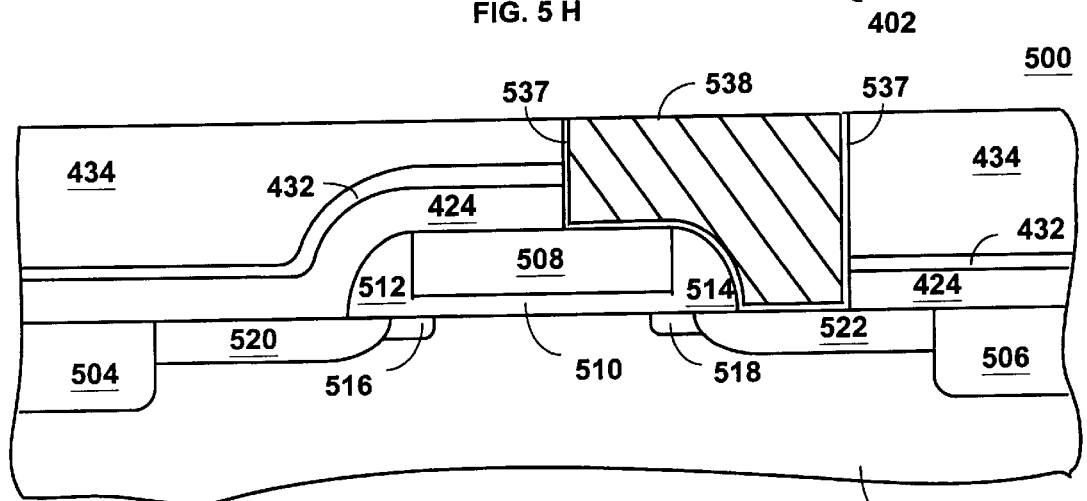
Figure 5:
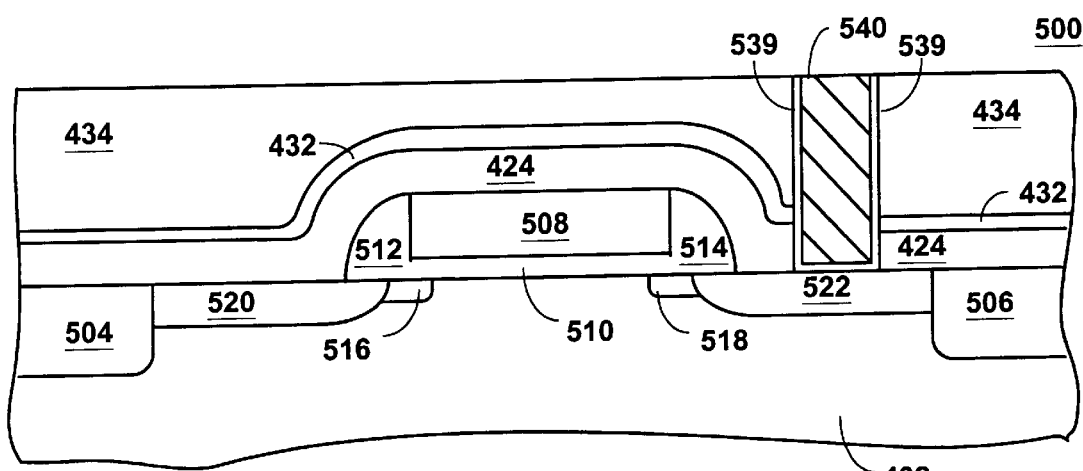

FIGS. 5A–5J show the structure and selected steps in a method of making a semiconductor device 500 in accordance with the present invention that does not have salicide layers. Like numerical designations are used in each of the figures for like elements. Like numerical designations are used in each of the FIGS. 5A–5J for like elements shown in FIGS. 4A–4L. FIG. 5A shows a portion of the semiconductor device 500 manufactured on the semiconductor substrate 402 with trench isolation regions 504 and 506. The trench isolation regions 504 and 506 can also be field oxide regions formed by a LOCOS process. The purpose of the trench isolation or the field oxide regions is to isolate an element from an adjacent region. The semiconductor device 500 has a gate 508, typically a polysilicon gate, separated from the semiconductor substrate by a gate oxide layer 510 with sidewall spacers 512 and 514 formed on each side of the gate 508. Lightly doped drain regions 516 and 518 are formed in the semiconductor substrate 402. The LDD regions are typically formed as described above. The formation of the LDD regions is typically done before the formation of the sidewall spacers. Ions that can be used to form LDD regions are phosphorous ions at a dosage of about 1E13 ions per centimeter squared.

FIG. 5B shows the semiconductor device 500 shown in FIG. 5A with a source region 520 and a drain region 522 formed in the semiconductor substrate 502. The formation of the source and drain regions 520 and 522 is typically done by ion implantation of appropriate ions and is well known in the semiconductor manufacturing art and will not be discussed. The concentration of the ions in the source and drain regions 520 and 522 is greater than the concentration of the ions in the LDD regions 516 and 518 and thus, the LDD regions 516 and 518 are shown subsumed by the source and drain regions 520 and 522. Ions that are typically implanted into the source and drain regions 516 and 518 are arsenic ions at a dosage of about 1E15 ions per centimeter squared.

FIG. 5C shows the device 500 with a hydrogen getter layer 424 formed over the entire surface of the device 500. The hydrogen getter layer 424 formed over the device 500 is the same hydrogen getter layer 424 that is formed over the device 400 discussed in conjunction with FIGS. 4A–4I. As discussed above, the hydrogen getter layer 424 is a film such as a PSG (phosphosilicate glass) film, a BPSG (borophosphosilicate glass) film, a PTEOS (phosphorus doped tetraethyl orthosilicate) deposited oxide film, or a BPTEOS (borophosphorus doped tetraethyl orthosilicate) deposited oxide film. The hydrogen getter layer 424 has a thickness between 1000–2000 Angstroms. The purpose of the hydrogen getter layer 424 is to getter hydrogen and protect underlying areas from forming salicide layers in subsequent processing steps.

FIG. 5D shows etch protect layer 523 formed on the device 500 to protect the hydrogen getter layer 424 from being removed.

FIG. 5E shows the device 500 with the protect layer 523 removed and a barrier layer 432 formed on the device 500. The barrier layer 432 is formed on the entire device. The barrier layer 432 as described above is a high temperature plasma silicon nitride, silicon oxynitride or an LPCVD silicon nitride film. The barrier layer 432 is used to protect underlying features of the device 500 from the typical etch materials used to etch silicon dioxide.

FIG. 5F shows the device 500 with a dielectric layer 434 that has been formed on the entire semiconductor device as well as the semiconductor device 500.

FIG. 5G shows the dielectric layer 434 planarized and an opening, indicated at 536, etched to expose a selected portion of the underlying device. The purpose of the dielectric material 434 is to electrically insulate the underlying portions of the device 500 from other elements that may be manufactured above the dielectric layer 434. The purpose of the opening 536 is to allow an electrical connection to the exposed portion of the underlying portion of the device 500.

FIG. 5H shows that the portion of the barrier layer 432 exposed by the opening 536 has been etched away and an adhesion layer 537 formed on the surfaces of the opening 536.

FIG. 5I shows the opening 536 filled with a conductive material 538, such as tungsten, which electrically connects the gate 508 to the drain region 522.

FIG. 5J shows an alternative embodiment with an electrical connection 540 that is to connect the drain region 522 to another device either on the same layer or on a different layer. The electrical connection 540 is formed by the method described above, that is, by etching an opening in the dielectric layer 434, forming an adhesion layer 539, and filling the opening with a conductive material, such as tungsten.

Figure 6:
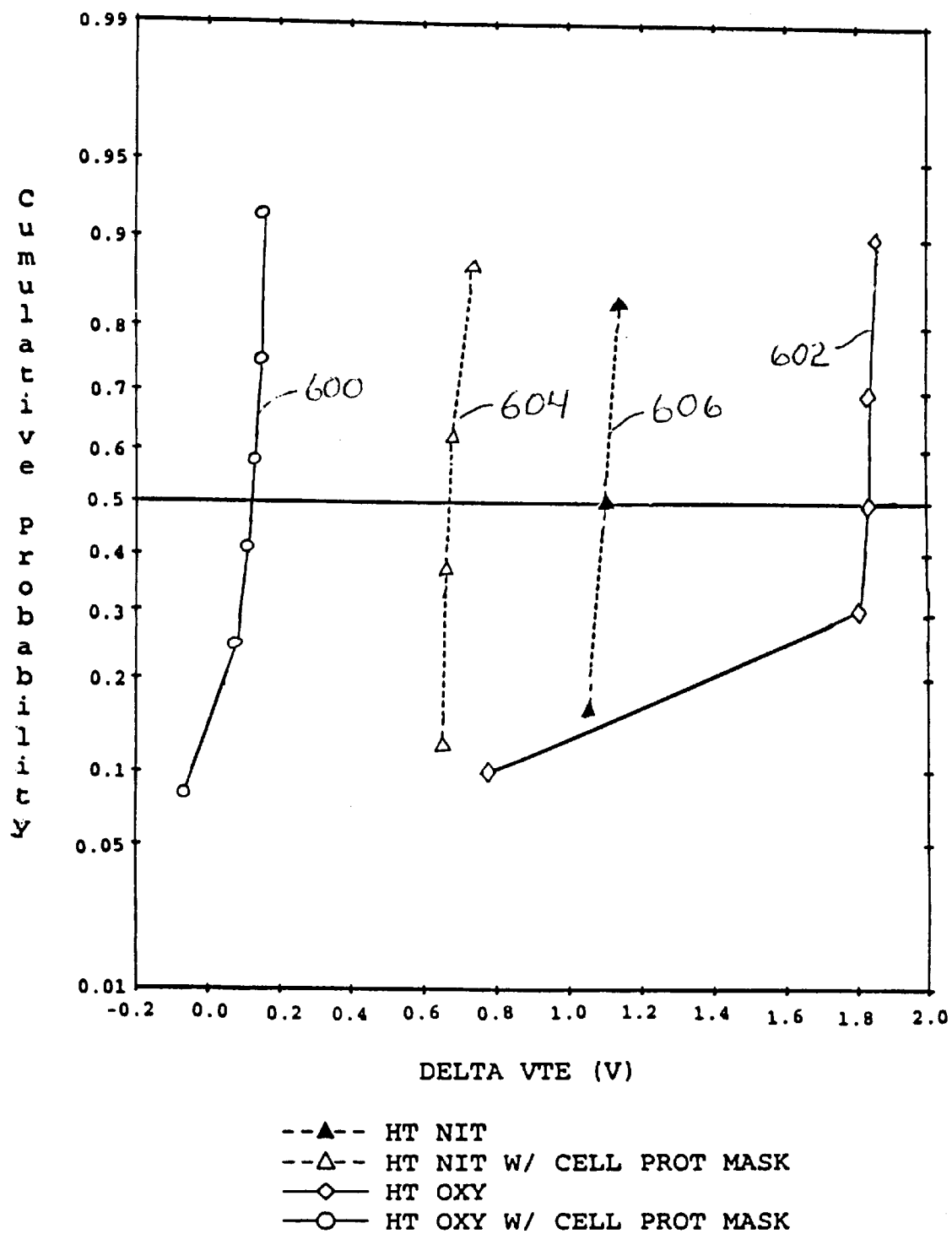
FIG. 6 is a diagram showing experimental measurements taken from devices manufactured with and without barrier layers on positive charge sensitive areas.

FIG. 6 is a diagram showing experimental test results on devices with and without the barrier layer over positive charge sensitive areas on a semiconductor device. The test results show the delta VTE (V) where VTE (V) is a measure of floating electrons on a floating gate and delta VTE (V) is a measure of the loss of floating electrons on the floating gate. The experimental results were obtained after the devices were baked at a temperature of 250 degrees Centigrade for 69 hours. The ideal floating gate would have a zero delta VTE (V) that would indicate no loss in charge. Curve 600 shows the delta VTE (V) for devices that have had the high temperature PECVD oxynitride barrier layer removed from over the positive charge sensitive areas. Curve 602 shows test results for similar devices shown in curve 600, however, the high temperature PECVD oxynitride barrier layer was not removed from over the positive charge sensitive areas. It is clear that the removal of the barrier layer substantially improved the delta VTE (V) characteristics. Curves 604 and 606 show similar improvements in the delta VTE (V) characteristics for devices that have a high temperature PECVD nitride layer that was removed from the positive charge sensitive areas. Although the improvement in the high temperature nitride devices was not as great as the improvement in the high temperature oxynitride devices, the improvement was very substantial.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What we claim:

1. A semiconductor device, comprising:

a semiconductor substrate;

a first type of device formed in a first portion of the semiconductor device;

at least a second type of device formed in a second portion of the semiconductor substrate;

a hydrogen getter layer having a thickness of approximately 1000–2000 Angstroms formed on a surface of the semiconductor device including over the first and second type of device, wherein the hydrogen getter layer is formed from a material selected from the group of a PSG film, a BPSG film, a PTEOS deposited oxide film and a BPTEOS deposited film;

a barrier layer formed on a surface of the hydrogen getter layer, wherein the barrier layer is formed from a material selected from the group of a nitride and oxynitride film; and wherein a portion of the barrier layer is removed from over the first type of device.

* * * * *